United States Patent [19]

Barrett

[11] Patent Number: 4,495,471
[45] Date of Patent: Jan. 22, 1985

[54] BUFFER AMPLIFIER

[75] Inventor: Ronald A. Barrett, Tigard, Oreg.

[73] Assignee: Tektronix, Inc., Beaverton, Oreg.

[21] Appl. No.: 533,683

[22] Filed: Sep. 19, 1983

[30] Foreign Application Priority Data

Oct. 12, 1982 [JP] Japan .................... 57-177692

[51] Int. Cl.$^3$ ............................. H03F 3/16
[52] U.S. Cl. ...................... 330/151; 330/300;
330/149; 330/290
[58] Field of Search ............. 330/149, 151, 290, 300

[56] References Cited

U.S. PATENT DOCUMENTS 4,409,561 10/1983 Shacter .................. 330/300

Primary Examiner—James B. Mullins
Assistant Examiner—Steven J. Mottola
Attorney, Agent, or Firm—George T. Noe

[57] ABSTRACT

A buffer amplifier input circuit includes both field-effect and bipolar transistors arranged in conjunction with an operational amplifier to provide very stable operation over a wide frequency range.

1 Claim, 5 Drawing Figures

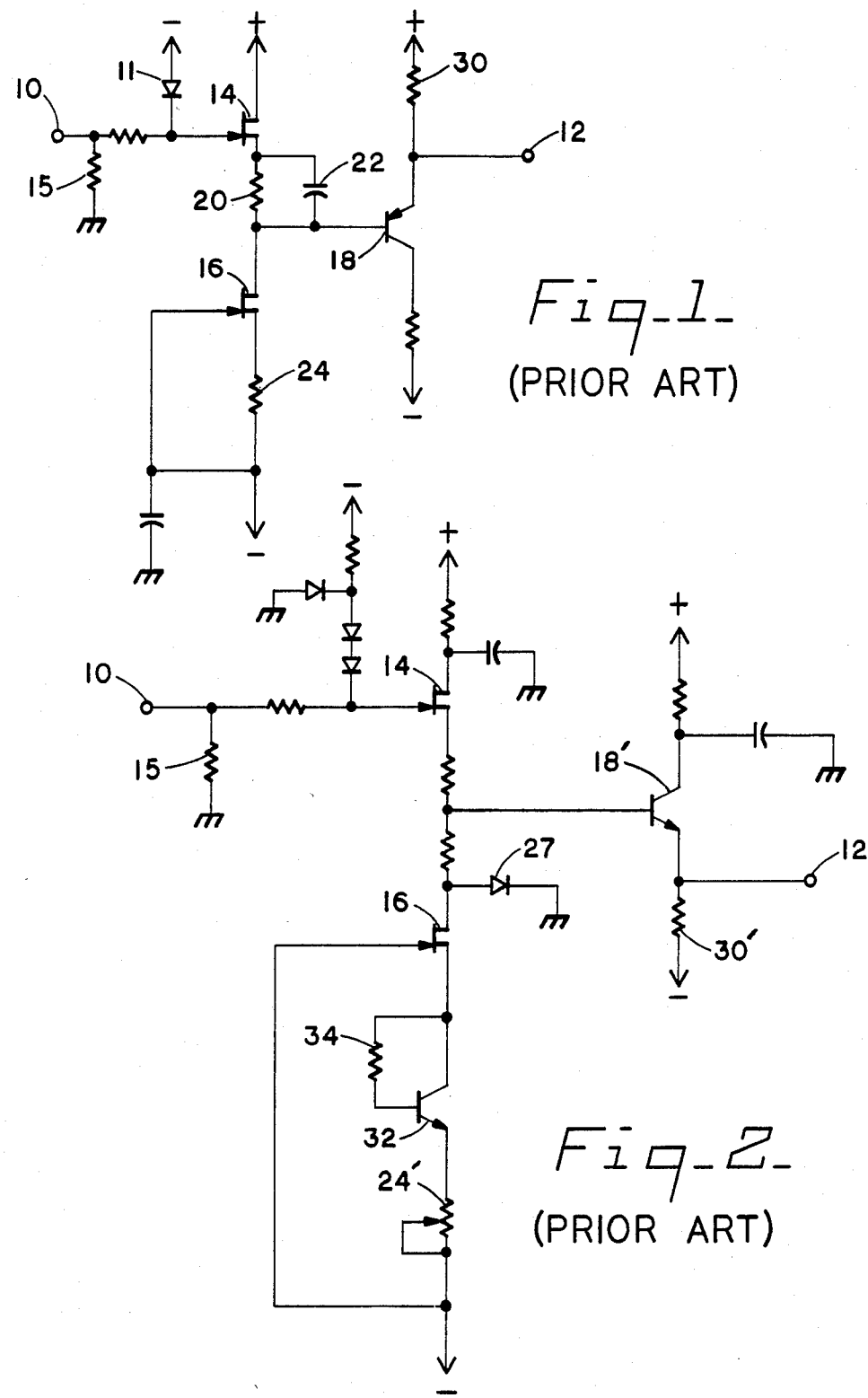
Fig_1_
(PRIOR ART)
Fig_2_
(PRIOR ART)

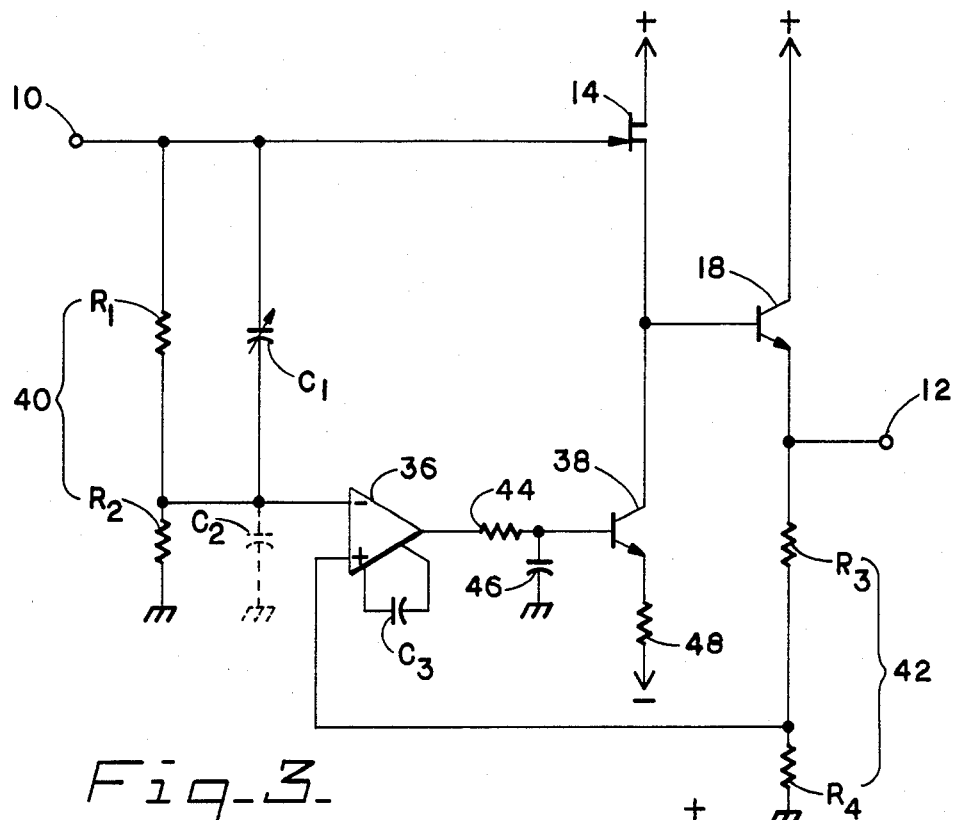
Fig_3_
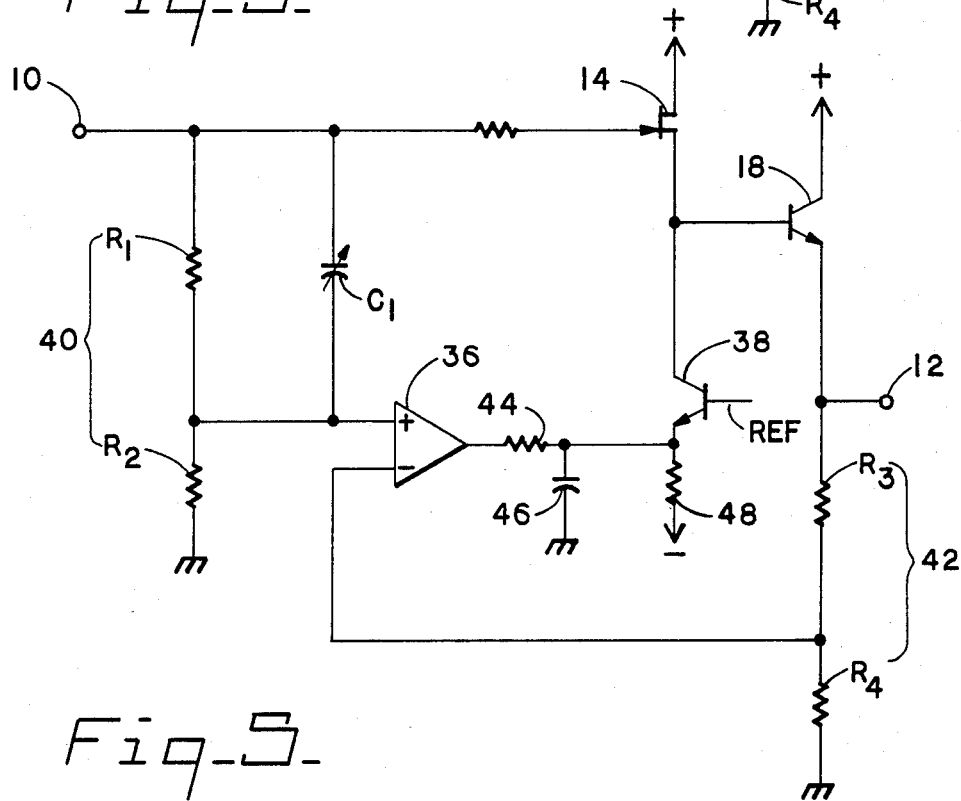
Fig_5_

BUFFER AMPLIFIER

BACKGROUND OF THE INVENTION

This invention pertains to a buffer amplifier, more specifically to a DC-coupled high-impedance input amplifier for an oscilloscope or the like.

Buffer amplifiers find wide application throughout the electronic industry. For example, wideband analog test and measurement instruments such as oscilloscopes require high impedance, highly stable, DC-coupled wideband input amplifiers. Buffer amplifiers herein refer to such input stage amplifiers having a high input impedance and a low output impedance.

Buffer amplifiers for this purpose typically include a DC-coupled source follower input field-effect transistor (FET) stage followed by an emitter follower output stage. One example of such conventional buffer amplifiers is shown in FIG. 1. The gate of source follower FET 14 is DC coupled to input terminal 10 and also connected to a negative voltage source through normally off clamp diode 11. The drain of FET 14 is connected to a positive voltage source while the source thereof is connected through a parallel combination of resistor 20 and capacitor 22 to a constant current source including another FET 16 and source resistor 24. The drain of FET 16 is directly coupled to the base of emitter follower transistor 18, the emitter of which is connected through resistor 30 to a positive voltage source and also to output terminal 12. The collector of transistor 18 is returned to a negative voltage source. Resistor 15 is connected between input terminal 10 and ground to determine input resistance of the amplifier.

Under no-signal condition, when the gate voltage of FET 14 is zero volts, proper parameter selection allows both FETs 14 and 16 to operate on the same DC level. That is, the drain voltage of FET 16 and the gate voltage of FET 14 are essentially equal to each other and resistors 20 and 24 have substantially equal resistance. In this case, the gate-to-source voltages and drain currents of both FETs 14 and 16 are identical. This establishes essentially zero voltage on the base of transistor 18. FET 16 provides temperature compensation for FET 14. For this purpose, FETs 14 and 16 must be a matched pair of high cutoff frequency and are relatively expensive.

When the input gate voltage increases, the source current of FET 14 exceeds the constant drain current of FET 16, the resulting difference current flows into the base of transistor 18, thereby reducing the emitter current of transistor 18 to raise the emitter output voltage on output terminal 12. On the other hand, when the input voltage is negative, the source current of FET 14 is less than the constant drain current of FET 16, thereby the resulting difference current increases the base and emitter currents of transistor 18 to provide a negative output voltage at output terminal 12.

Drawbacks of the prior art circuit include difficulty of obtaining completely matched pair of FETs for wide range operation, high cost of the matched FET pair and voltage drift of transistor 18.

FIG. 2 shows another conventional buffer amplifier to solve some of the drawbacks of the FIG. 1 circuit. The biggest difference of FIG. 2 circuit over FIG. 1 circuit is the use of diode connected transistor 32 in the source circuit of FET 16. Transistor 32 with the base and collector thereof coupled to each other through resistor 34 preferably constitutes with emitter follower transistor 18' a matched bipolar transistor pair. FIG. 2 circuit operates much the same way as FIG. 1 circuit, but diode connected transistor 32 provides the temperature compensation of emitter follower transistor 18'. That is, when the ambient temperature rises to reduce the $V_{BE}$ of transistor 18', the $V_{BE}$ of transistor 32 also decreases, thereby increasing the drain current of FET 16. The base voltage of transistor 18' is reduced to keep the output voltage at output terminal 12 constant. The output voltage is, therefore, maintained substantially unchanged by the use of matched FET pair 14 and 16 and also matched bipolar transistor pair 18' and 32. Resistance of resistor 34 is chosen so that transistors 32 and 18' operate on a similar bias level to each other for better temperature compensation.

Basically, this invention features the use of a single source follower FET, a pair of bipolar transistors (not required to be a matched pair), and an operational amplifier. One bipolar transistor is connected in series with the source of the input stage source follower FET while the other is used as an output stage emitter follower transistor. A selected fraction of the input and output signals are compared with each other by the operational amplifier to provide low-frequency correction for the entire amplifier. The correction loop automatically maintains the output DC level constant.

The FIG. 2 circuit is more expensive than the FIG. 1 circuit because expensive matched bipolar transistor air 18' and 32 are required.

It is therefore a primary object of this invention to provide a buffer amplifier that is less expensive and less complicated in circuit arrangement.

It is another object of this invention to provide a wideband buffer amplifier with better electrical performance, expecially in DC stability than conventional amplifiers.

A feature of the buffer amplifier of the present invention is that it corrects for internally-generated low-frequency distortion.

Other objects, features, and advantages of the present invention will become apparent to those having skill in the art upon a reading of the following description when taken in conjunction with the accompanying drawings.

DRAWINGS

FIG. 1 is a schematic diagram of a prior art buffer amplifier;

FIG. 2 is a schematic diagram of another prior art buffer amplifier;

FIG. 3 is a simplified schematic diagram of a preferred embodiment of the present invention;

FIG. 5 is an alternative embodiment of the present invention.

DETAILED DESCRIPTION OF THE INVENTION

Figure 4:
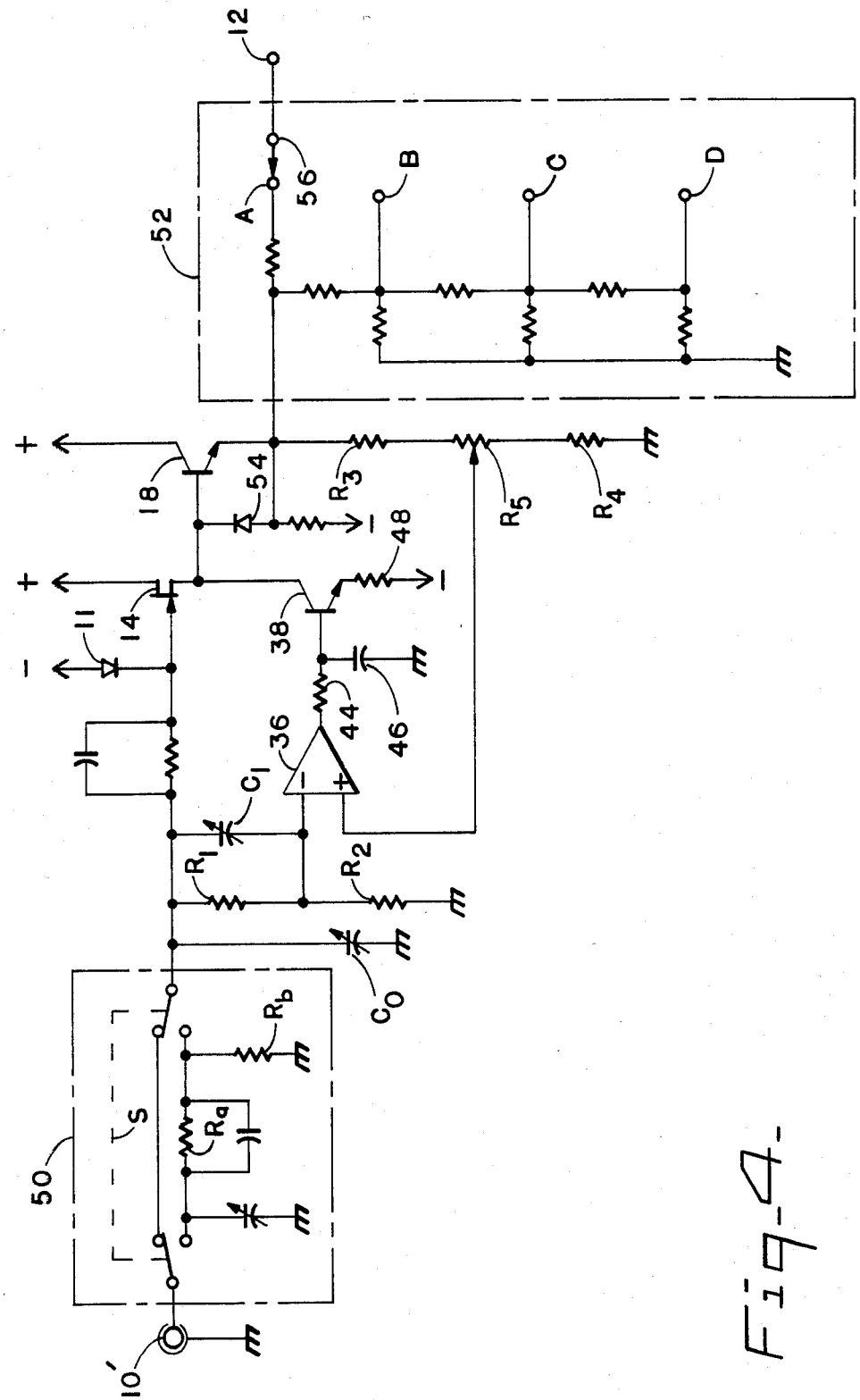
FIG. 4 is a schematic diagram of the preferred embodiment implemented in a practical input circuit.

FIG. 3 is a simplified circuit schematic of one preferred embodiment of this invention. Input terminal 10 is connected to the gate of FET 14 with the drain thereof connected to a positive voltage source and with the source thereof returned to a negative potential via the current source consisting of bipolar transistor 38 and 48. The source voltage is applied to the base of emitter follower transistor 18 to the emitter of which output terminal 12 is connected. Input divider 40 comprising resistors $R_1$ and $R_2$ and variable capacitor $C_1$ is connected between input terminal 10 and reference potential source (ground). $R_1$, $R_2$ and $C_1$ have dual functions; one as a wideband resistive divider along with input and stray capacitance $C_2$ and the other as an input resistance (e.g. one megohm) of the entire amplifier. As is known to a person skilled in the art, capacitor $C_1$ is adjusted to establish $R_1C_1=R_2C_2$. Connected between output terminal 12 and reference potential source is output divider 42 consisting of a pair of resistors $R_3$ and $R_4$ connected in series with each other. Both dividers 40 and 42 are designed to exhibit essentially equal dividing ratios and the divided fractional input and output signals are respectively applied to the inverting and non-inverting input terminals of operational amplifier 36. Operational amplifier 36 may include an FET input stage. The error signal from operational amplifier 36 is then fed to the base of transistor 38 through a low pass filter comprising of resistor 44 and capacitor 46. Capacitor $C_3$ limits the frequency response of the correction amplifier and reduces noise. At high frequencies, FET 14 and bipolar transistor 18 operate as a conventional buffer, unaffected by operational amplifier 36.

In operation, the input signal applied to input terminal 10 is amplified by wideband amplifier including source follower FET 14 and emitter follower transistor 18 with substantially unity gain. Operational amplifier 36 compares the fractions of the input signal from input divider 40 and the output signal from output divider 42. Any error disagreement between the input and output signals is amplified by high-gain operational amplifier 36 before being applied to the base of transistor 38 through the low pass filter network. The signal loop including dividers 40 and 42 and operational amplifier 36 is used to maintain stability and accuracy at low frequencies.

Under no-signal condition when the input terminal 10 is zero volts, the output voltage at output terminal 12 is also zero volts. If the output voltage differs from the input voltage because of a change in the gate-to-source voltage ($V_{gs}$) of FET 14 or the base-to-emitter voltage ($V_{BE}$) of transistor 18, and variations in $V_{gs}$ and $V_{BE}$ under different operating conditions, a fraction of such error is fed back to operational amplifier 36 and corrected automatically by operational amplifier 36 and current source transistor 38. This means that the output voltage is automatically maintained equal to the input under this condition regardless of $V_{gs}$ and $V_{BE}$. The same is true when the input DC voltage changes. That is, the output DC level accurately and promptly follows the input DC level due to the control loop. The dividing ratio of divider 40 and 42 may be any desired value, e.g. one-half.

FIG. 4 shows a more detailed circuit schematic of a practical embodiment of this invention. The embodiment is essentially the same as FIG. 3 except the addition of input attenuator 50 and output attenuator 52. Input attenuator 50 includes switch S to selectively interpose or bypass a resistive attenuator comprising series resistor Ra and shunt resister Rb in addition to capacitors, thereby attenuating the input signal by a desired factor (e.g. one-tenth). More than one attenuator stage may be connected in a cascade manner. Variable capacitor $C_o$ is used to normalize the input capacitance of the buffer amplifier. Diodes 11 and 54 are used for over-voltage protection purposes. Output attenuator 52 includes a resistive network and a four-position switch 56. The resistors of proper resistance value are used as the resistive network to provide the required attenuation factors while maintaining constant source resistance at any position A, B, C or D of switch 56.

FIG. 5 shows an electrical circuit schematic of an alternative embodiment of this invention. This buffer amplifier is essentially the same as the one in FIG. 3 except that the output of operational amplifier 36 is applied to the emitter of transistor 38 and the polarity of operational amplifier 36 is reversed. Since this buffer amplifier operates much the same way as FIG. 3, no additional description is necessary for a person skilled in the art.

While I have shown and described the preferred and alternative embodiments of my invention, it will become apparent to those skilled in the art that many changes and modifications may be made without departing from the invention in its broader aspects.

What I claim as being novel is:
1. A buffer amplifier, comprising:
   a field effect transistor having a gate DC coupled to an input terminal;
   a bipolar transistor the principal current path of which is coupled in series with the source of said field effect transistor;
   an emitter follower transistor connected to the source side of said field effect transistor;
   an input divider connected to the input terminal;
   an output divider connected to the output end of said emitter follower transistor; and
   an operational amplifier for amplifying the voltage difference from said input and output dividers and providing the output thereof to the control electrode of said bipolar transistor.

* * * * *